(12) United States Patent
Muthers

(10) Patent No.: US 8,125,221 B2
(45) Date of Patent: Feb. 28, 2012

(54) METHOD AND DEVICE FOR MEASURING AN ANGLE AT WHICH A MAGNETIC FIELD IS ALIGNED IN A PLANE RELATIVE TO A REFERENCE AXIS

(75) Inventor: David Muthers, Freiburg (DE)

(73) Assignee: Micronas GmbH, Freiburg I.BR. (DE)

( * ) Notice: Subject to any disclaimer, the term of this patent is extended or adjusted under 35 U.S.C. 154(b) by 394 days.

(21) Appl. No.: 12/533,350

(22) Filed: Jul. 31, 2009

(65) Prior Publication Data

US 2010/0026287 A1 Feb. 4, 2010

(30) Foreign Application Priority Data

Aug. 1, 2008 (EP) .................................... 08013832

(51) Int. Cl.
*G01R 33/02* (2006.01)
(52) U.S. Cl. ...................................................... 324/246
(58) Field of Classification Search .................. 324/246, 324/117 H, 247, 251, 260, 262
See application file for complete search history.

(56) References Cited

U.S. PATENT DOCUMENTS

| | | | |
|---|---|---|---|
| 3,903,610 | A | 9/1975 | Heaviside et al. |
| 4,013,946 | A | 3/1977 | Lewis |
| 4,536,685 | A | 8/1985 | Fattal et al. |
| 4,819,103 | A * | 4/1989 | Okamura .......................... 360/51 |
| 6,552,662 | B1 * | 4/2003 | Bomya et al. ............... 340/572.1 |
| 6,653,831 | B2 * | 11/2003 | Friend et al. .................. 324/244 |
| 6,777,927 | B1 * | 8/2004 | Bomya ..................... 324/207.17 |
| 2003/0132761 | A1 | 7/2003 | Poirier | |

FOREIGN PATENT DOCUMENTS

| | | |
|---|---|---|
| WO | 96/16316 A1 | 5/1996 |
| WO | 03/012478 A2 | 2/2003 |

OTHER PUBLICATIONS

Phillips, Data Sheet, UZZ9001, Sensor Conditioning Electronic, Nov. 27, 2000, (pp. 1-16).
S. Reymond et al., True 2D CMOS integrated Hall sensor, IEEE Sensors 2007 Conference, Oct. 28, 2007, (pp. 860-863).

* cited by examiner

*Primary Examiner* — Roberto Velez
*Assistant Examiner* — Kathryn Chang
(74) *Attorney, Agent, or Firm* — Muncy, Geissler, Olds & Lowe, PLLC

(57) ABSTRACT

A device for measuring an angle at which a magnetic field is aligned in a plane relative to a reference axis has at least two magnetic field sensors, which are aligned with their measurement axes in and/or parallel to the plane and oriented at right angles to each other. The device has a PLL phase control circuit with a follow-on oscillator arranged in a phase control loop, which has at least one oscillator output for a digital oscillating signal. The magnetic field sensors are coupled to the phase control loop in such a way that the digital oscillating signal is phase synchronous with a rotation scanning signal formed by rotary scanning of the measurement signals of the magnetic field sensors. The oscillator output is connected to a phasing detector for determining the phasing of the digital oscillating signal.

11 Claims, 3 Drawing Sheets

Figure 1:
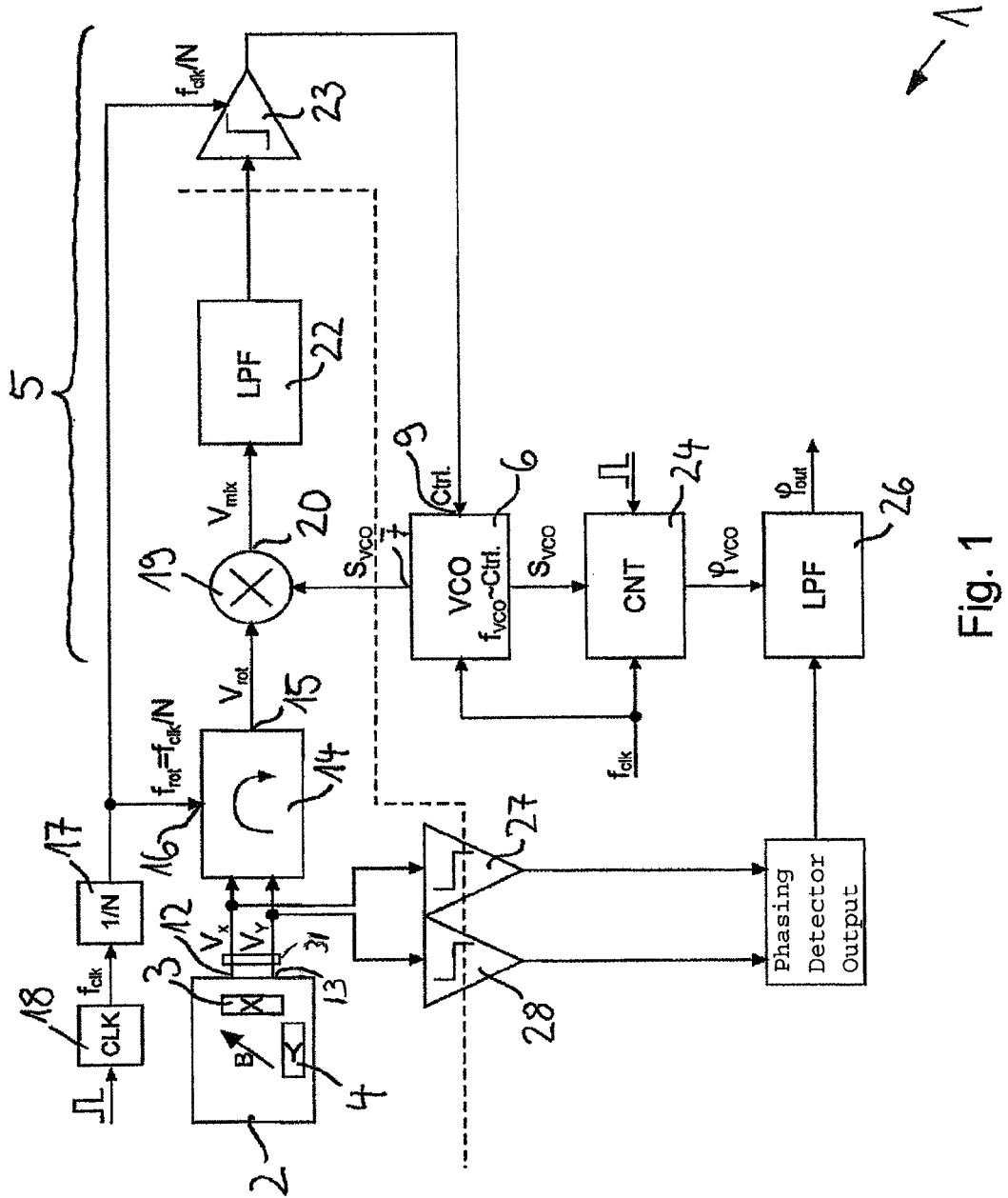

METHOD AND DEVICE FOR MEASURING AN ANGLE AT WHICH A MAGNETIC FIELD IS ALIGNED IN A PLANE RELATIVE TO A REFERENCE AXIS

BACKGROUND OF THE INVENTION

1. Field of the Invention

The invention relates to a device for measuring an angle at which a magnetic field is aligned in a plane relative to a reference axis, with at least two magnetic field sensors which are aligned with their measurement axes in and/or parallel to the plane and oriented perpendicular to each other. The invention further relates to a method for measuring an angle, at which a magnetic field is aligned in a plane relative to a reference axis, wherein a first magnetic field component and a second magnetic field component aligned perpendicular thereto are measured in and/or parallel to the plane.

2. Description of Related Art

A device of the aforesaid type is disclosed in Reymond, S. et al., "True 2D CMOS integrated Hall sensor", IEEE SENSORS 2007 Conference, pp. 860-863, which has a semiconductor substrate in which are integrated so-called vertical Hall sensors as magnetic field sensors 64. The magnetic field sensors are equidistantly arranged relative to each other on a circular ring residing in the chip plane of the semiconductor substrate in such a way that the planes in which the magnetic field sensors extend are always radially aligned relative to an imaginary center axis, which passes through the center point of the circular ring and is aligned at right angles to the chip plane. The magnetic field sensors are connected to a scanning device in such a way that the measurement signals of the individual magnetic field sensors are capable of being applied successively to a differential output terminal for a rotation scanning signal. Cyclically rotating, successive scanning of the magnetic field sensors is thus carried out. The differential output terminal is connected via a differential amplifier to a low pass integrated in the semiconductor substrate. By means of the low pass, the analog output signal of the amplifier is smoothed to an approximately sinusoidal signal. The zero crossing of the analog measurement signal thus achieved is determined, and the angle at which a magnetic field flowing through the semiconductor substrate in the chip plane is aligned relative to a reference axis is determined from the zero crossing point.

A disadvantage resides in the device in that the scanning of the many magnetic field sensors is time-consuming. In spite of the complex circuitry, the device enables only a small band width. A further disadvantage resides in the fact that the non-degenerative, analog low pass must meet stringent requirements in terms of linearity and frequency response, which entails a considerable use of surface area on the chip and a high power consumption.

A device of the aforementioned type is also disclosed in DATA SHEET UZZ9001, Sensor Conditioning Electronics Product Specification, Philips Semiconductors, 27 Nov. 2000, which has two magnetoresistive sensors integrated as magnetic field sensors in a semiconductor chip, which are aligned with their measurement axes in a plane at right angles relative to each other. Each magnetic field sensor is in each case connected to an analog-digital convertor, which is configured as a sigma-delta modulator. A decimation filter, at whose output is emitted a magnetic field measurement value in the form of a 15 bit digital word, is always disposed downstream relative to each analog-digital convertor. The digital words are transmitted to a calculator, which calculates the angle at which a magnetic field flowing through the semiconductor substrate is aligned in the chip plane relative to a reference axis from the arctangent of the quotient of the digital words. The relatively highly complex circuitry is also disadvantageous herein. The calculation of the magnetic field angle results in a latency, which poses a disadvantageous when the device is used in a control circuit.

The object is therefore to create a device of the aforesaid type which enables a simple construction and a high measurement precision. A further object is to design a method of the aforesaid type with which the angle can be easily determined with high precision.

SUMMARY OF THE INVENTION

With regard to the device, the object is achieved wherein the device has a PLL phase control circuit with a follow-on oscillator arranged in a phase control loop, wherein the follow-on oscillator has at least one oscillator output for a digital oscillating signal, wherein the magnetic field sensors are coupled to the phase control loop so that over an angular range of 360° the digital oscillating signal is phase synchronous with a rotation scanning signal formed by rotary scanning of the measurement signals of the magnetic field sensors, and wherein the oscillator output for determining the phasing of the digital oscillating signal is connected to a phasing detector.

The device thus has a simply designed, economically manufacturable phase-locked loop (PLL) phase control circuit, which is synchronous with the phase of a rotation scanning signal formed by rotary scanning of the measurement signal outputs of the magnetic field sensors. "Synchronous" is understood to mean that the phasing of the digital oscillating signal is identical to that of the rotation scanning signal or displaced by a known, constant angle. The angle at which the magnetic field is aligned relative to the reference axis in the plane spanned by the axes of the magnetic field sensors can thus be easily measured by determining the phasing of the digital oscillating signal.

It is advantageous if the magnetic field sensors are connected to a scanning device in such a way that the measurement signals of the individual magnetic field sensors are capable of being applied successively to an output terminal for the rotation scanning signal, and if the output terminal is connected to a synchronization signal input of the PLL phase control circuit The scanning device can thus be disposed downstream of the measurement signal terminals of the magnetic field sensors. However, it is also conceivable that the magnetic field sensors or their circuitry components are switched on or off by means of the scanning device, in order to activate or deactivate the respective magnetic field sensor.

In an advantageous embodiment of the invention, each magnetic field sensor always has a measurement signal output connected to a multiplexer, wherein the multiplexer has an output capable of being connected to the individual input terminals, which forms the output terminal for the rotation scanning signal. The construction of the device is thus further simplified.

In a preferred embodiment of the invention, the output terminal for the rotation scanning signal is connected to a first input of a frequency mixer and the oscillator output of the follow-on oscillator is connected to a second input of the frequency mixer, wherein a mixer output of the frequency mixer is connected to a frequency control input of the follow-on oscillator via at least one low pass and at least one synchronized comparator. By means of the frequency mixer and the low pass disposed downstream relative thereto, an analog signal is generated for the difference frequency between the rotation frequency of the rotation scanning signal and that of the digital oscillating signal. Said analog signal is then converted by means of the comparator to a digital control signal for the follow-on oscillator. The analog low pass of the phase control loop enables a high loop amplification in the signal band of the angle change with simultaneous low loop amplification in the rotation frequency, so that a spectral displacement of the quantization noise from the signal band, or noise shaping, takes place. As with any sigma-delta modulator, the arrangement and the frequency response of the low pass can be adapted to the specific conditions of the application.

It is advantageous if the phasing detector has a quadrant detector, which has a first polarity detector and a second polarization detector, that an input of the first polarization detector is connected to a measurement signal output of a first magnetic field sensor and an input of the second polarization detector is connected to a measurement signal output of a second magnetic field sensor, and if the second magnetic field sensor is aligned with its measurement axis orthogonal to the measurement axis of the first magnetic field sensor. In this way it is possible to assign the measured magnetic field angle to a precise quadrant and thus determine the amount and the sign of the angle.

In an improvement of the invention, the magnetic field sensors are Hall sensors, which have a switch device for the orthogonal switching of the Hall sensor supply current and the Hall voltage taps, wherein the switch device has a clock input connected to a clock for a switching clock signal. The invention can therefore also be combined with the so-called spinning current technique.

It is advantageous if the pulse frequency of the switching clock signal of at least one magnetic field sensor is selected so that within a scanning cycle during which the measurement signal of this magnetic field sensor is coupled to the phase control loop, the orthogonal switching device assumes at least two and preferably four different switching statuses. By averaging the four possible polarities of the Hall sensors, it is possible to reduce a measurement-induced offset substantially. The mixer bandwidth increases due to the higher pulse frequency of the switching clock signal.

In another advantageous embodiment of the invention, the pulse frequency of the switching clock signal of at least one magnetic field sensor is selected so that the Hall sensor supply current of the magnetic field sensor changes its direction once after each rotation cycle of the rotation scanning signal. A spinning cycle is then completed after four rotation cycles of the rotation scanning signal. The spinning frequency $f_{spin}$ is then expressed as $f_{spin}=(f_{rot}/4)=(f_{clk}/4N)$, wherein $f_{rot}$ is the rotation frequency of the rotation scanning signal and $f_{clk}$ is the pulse frequency of a clock. The individual phase offsets of the magnetic field sensors are thus displaced from f=0 to $f_{spin}$. A decimation filter can suppress these frequency components, thus enabling the averaging of the sensor offsets without additional expenditure.

Preference is given to the comparator having a clock signal input connected to a clock signal generator, wherein the clock signal generator is configured so that the pulse frequency of a comparator clock signal residing at the clock signal input is at least twice as large as the rotation frequency of the rotation scanning signal. The finding that the output signal of the frequency mixer oscillates with the frequency $f_{mix}=2 f_{rot}$ when the phase control loop is engaged is thus exploited. By the faster pulsing of the comparator, the angle of the magnetic field can be measured even more quickly.

In an advantageous embodiment of the invention, the follow-on oscillator has a number of oscillator outputs for digital oscillating signals phase-displaced relative to each other corresponding to the number of magnetic field sensors aligned with their measurement axes at right angles to each other, wherein a number of frequency mixers corresponding to the aforesaid number is arranged in the phase control loop, wherein each frequency mixer always has a first input connected to a measurement signal output of a magnetic field sensor allocated to the frequency mixer and a second input connected to one of the oscillator outputs, and wherein the mixer outputs of the frequency mixers are connected via an adding element, at least one low pass, and at least one synchronized comparator to the frequency control input of the follow-on oscillator. Preference is given to the scanning rate of the comparator having a frequency four times higher than the rotation cycle. The angle of the magnetic field can thus be measured even faster.

Mention should still be made that the measurement precision of the device can also be increased by always providing, for each measurement axis, several magnetic field sensors aligned parallel relative to each other, and by averaging the measurement signals of these magnetic field sensors.

Regarding the method of the aforementioned type, the object mentioned in the preceding is achieved by generating at least one digital oscillating signal, by controlling the phasing of the digital oscillating signal so that over an angular range of 360° it is phase synchronous with the phasing of a rotation scanning signal formed by rotary scanning of the measurement signals of the magnetic field sensors, and by measuring the angle of the phasing of the digital oscillating signal.

In an advantageous manner, it is thus possible to measure easily the angle at which the magnetic field is aligned in the plane spanned by the axes of the magnetic field sensors relative to the reference axis by determination of the phasing of the digital oscillation signal.

Illustrative embodiments of the invention are explained in more detail in the following, with reference to the drawing. Shown are:

BRIEF DESCRIPTION OF THE DRAWING(S)

Figure 2:
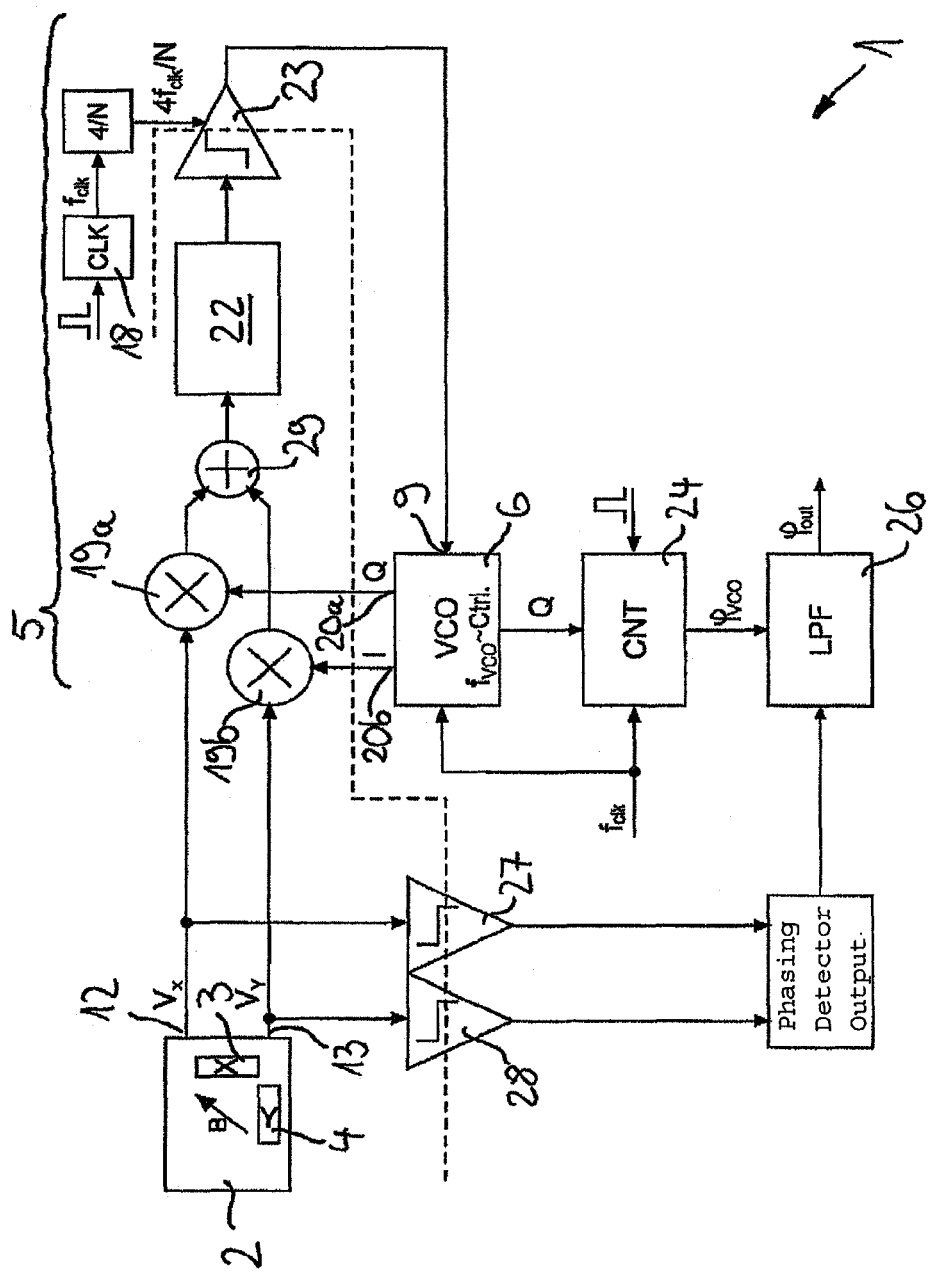
Figure 3:
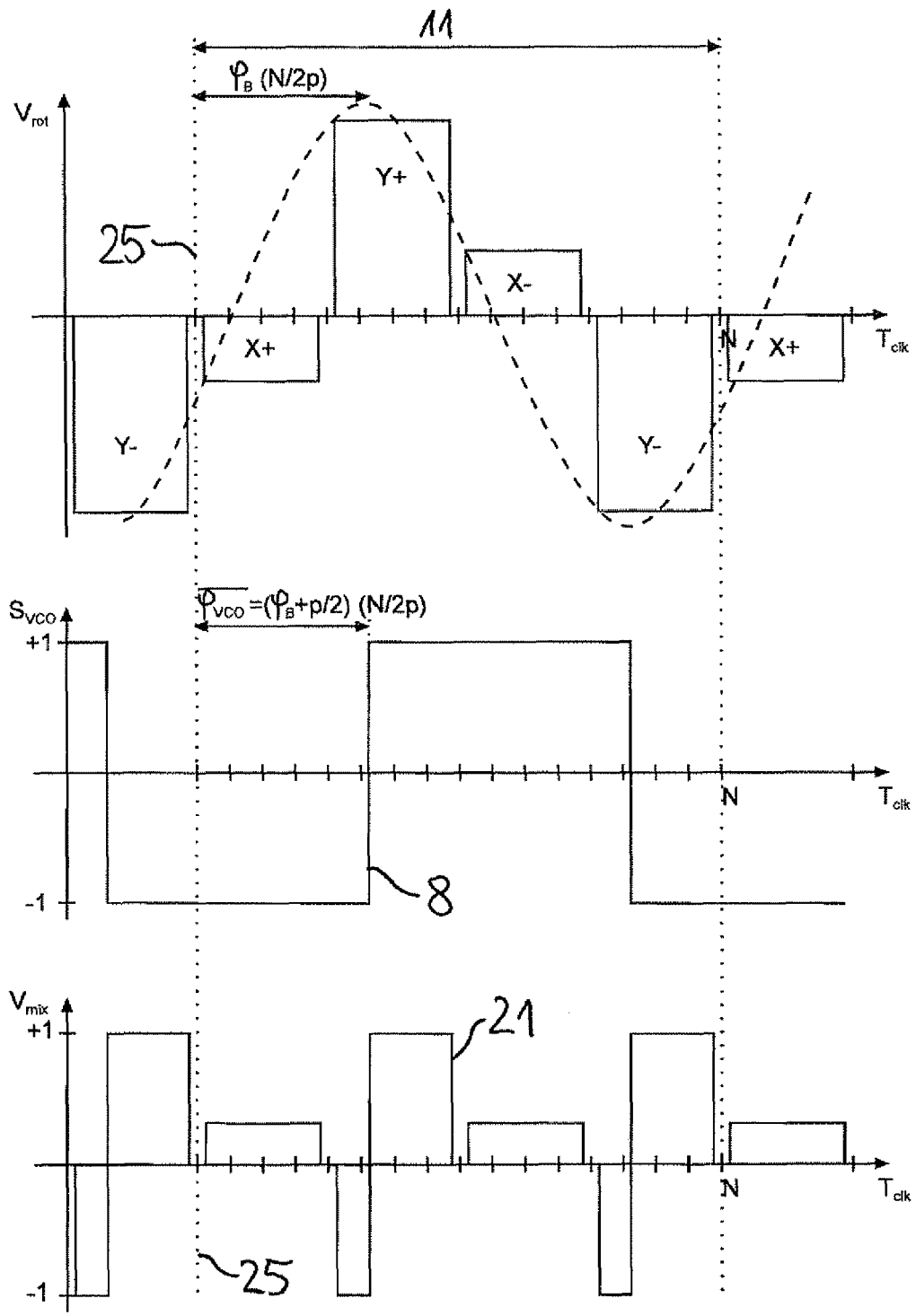

FIG. 1 a first illustrative embodiment of a device for measuring an angle at which a magnetic field is aligned in a plane relative to a reference axis, FIG. 2 a second illustrative embodiment of the device, and FIG. 3 a graphic illustration of a rotation scanning signal $V_{rot}$, a digital oscillating signal $S_{vco}$ and an oscillating signal $V_{mix}$ at the output of a frequency mixer of the device, wherein on the abscissa is plotted the time and on the ordinate is plotted the amplitude of the corresponding signal.

DESCRIPTION OF THE PREFERRED EMBODIMENT(S)

A device designated in its entirety by 1 for measuring an angle at which a magnetic field B is aligned in a plane 2 relative to a reference axis has two magnetic field sensors 3, 4 configured as Hall sensors, which are aligned with their measurement axes at right angles to each other. A first magnetic field sensor 3 is sensitive to an x-component of the magnetic field B and a second magnetic field sensor 4 is sensitive to a y-component of the magnetic field B.

The magnetic field sensors 3, 4 are integrated in a semiconductor chip, which is not shown in any greater detail in the drawing. They each have a Hall plate monolithically integrated in a semiconductor substrate, which is aligned with its extension plane perpendicular to the plane of the semiconductor chip.

In FIGS. 1 and 2 it can be discerned that the device 1 has a PLL phase control circuit 5 with a phase control loop, in which is integrated a follow-on oscillator 6. The follow-on oscillator 6 in the illustrative embodiment of FIG. 1 has an oscillator output 7 for an approximately rectangular digital oscillating signal 8. The follow-on oscillator 6 has a frequency control input 9 for adjusting the base frequency of the digital oscillating signal 8. The fundamental frequency of the digital oscillating signal 8 is dependent on a voltage residing at the frequency control input 9.

The magnetic field sensors 3, 4 are coupled to the phase control loop in such a way that the digital oscillating signal is phase synchronous with a rotation scanning signal 10 formed by rotary scanning of the measurement signals of the magnetic field sensors 3, 4. In FIG. 3, the scanning values contained in the rotation scanning signal 10 detected by the measurement signal of the first magnetic field sensor 3 are designated in each case with X+ or X− and the scanning values detected by the measurement signal of the second magnetic field sensor 4 are designated in each case with Y+ or Y−. It can be clearly discerned that with each rotation cycle 11 of the rotation scanning signal 10, scanning values X+, Y+, X−, Y− allocated in each case to the different magnetic field sensors 3, 4 are successively, cyclically generated. A sinusoidal curve allocated to the rotation scanning signal 10, whereon the detected measurement values reside, is also illustrated with dashes in FIG. 3.

In the illustrative embodiment shown in FIG. 1, the measurement signal outputs 12, 13 of the magnetic field sensors 3, 4 are in each case connected to an input terminal of a multiplexer 14. By means of the multiplexer 14 the measurement signal outputs 12, 13 are each successively, cyclically connected to an output terminal 15 for the rotation scanning signal 10 provided on the multiplexer 14. In FIG. 1 it can be further discerned that the multiplexer 14 has a control input 16 at which a rotation clock signal resides. The rotation clock signal is formed by means of a frequency divider 17 from an internal clock of a clock signal generator 18. In FIG. 1 the frequency of the rotation clock signal is designated with $f_{rot}$ and the frequency of the internal clock is designated with $f_{clk}$. The division ratio N of the frequency divider 17 corresponds to the number of clock pulses that a rotation cycle lasts.

The output terminal 15 for the rotation scanning signal 10 is connected to a first input of a frequency mixer 19 serving as a synchronization signal input for the phase control circuit 5 and the oscillator output 7 of the follow-on oscillator 6 is connected to a second input of the frequency mixer 19. At a mixer output 20 of the frequency mixer 19 resides a mixed signal 21, which corresponds to the product of the rotation scanning signal $V_{rot}$ and the digital oscillating signal 8 (FIG. 3).

The magnetic field sensors 3, 4 may be connected to a scanning device 31 in such a way that the measurement signals of the individual magnetic field sensors 3, 4 are capable of being applied successively to an output terminal for the rotation scanning signal, and if the output terminal is connected to a synchronization signal input of the PLL phase control circuit 5. The scanning device 31 can thus be disposed downstream of the measurement signal terminals 12, 13 of the magnetic field sensors 3, 4. However, it is also conceivable that the magnetic field sensors 3, 4 or their circuitry components are switched on or off by means of the scanning device 31, in order to activate or deactivate the respective magnetic field sensor 3, 4.

The mixer output 20 of the frequency mixer 19 is connected via an analog low pass 22 to an input of a comparator 23 synchronized with the rotation clock signal. The comparator evaluates the analog filtered signal after each rotation cycle. In the simplest case, its resolution can equal 1 bit. At the output of the comparator 23 resides a digital signal, which is transmitted to the frequency control input 9 of the follow-on oscillator 6 in order to form a control loop.

It can be discerned in FIG. 3 that when the phase control circuit is engaged the digital oscillating signal 8 is phase synchronous with the rotation scanning signal 10 or with the sinusoidal curve illustrated with dashes. The unique properties of the follow-on oscillator give rise to a ca. 90° phase displacement between the digital oscillating signal 8 and the rotation scanning signal 10.

To determine the angle at which the magnetic field B is aligned in the plane 2 relative to the reference axis, the device 1 has a phasing detector. The latter has a counter 24 for the clock pulses of the internal clock. The counter 24 is started by a start pulse, which marks a virtual zero phasing 25 corresponding to the reference axis for measurement of the angle. The counter 24 stops once a slope or a zero crossing arises in the digital oscillating signal. At the output of the counter 24 resides a digital signal $\phi_{vco}$ corresponding to the phase angle of the digital oscillating signal 8. The output of the counter 24 is connected to a first input of a low-pass filter 26.

The phasing detector further comprises a quadrant detector, which has a first polarity detector 27 and a second polarization detector 28. An input of the first polarization detector 27 is connected to the measurement signal output 12 of the first magnetic field sensor 3 and an input of the second polarization detector 28 is connected to the measurement signal output 13 of a second magnetic field sensor 4.

An output of the phasing detector is connected to a second input of the low-pass filter 26. At the output of the low-pass filter 26 resides a measurement signal $\phi_{out}$ corresponding to the angle of the magnetic field.

In FIG. 3 it can be discerned that, with the phase control loop engaged, the mixer output signal $V_{mix}$ oscillates with the frequency $f_{mix}=2f_{rot}$. With omission of the rotation phases 2 and 3 it is thus possible to exert an influence without the functionality. The follow-on oscillator 6 then only executes half periods. The comparator is likewise twice as rapidly synchronized with the frequency $f_{comp}=2f_{clk}/N$, thus doubling the loop band width and the scanning rate.

An additional doubling of the loop band width is possible with the illustrative embodiment shown in FIG. 2. In this embodiment the follow-on oscillator 6 has oscillator outputs 7a, 7b for two digital oscillating signals. A first digital oscillating signal resides at a first oscillator output 7a and a second digital oscillating signal resides at a second oscillator output 7b of the follow-on oscillator 6. The first digital oscillating signal and the second digital oscillating signal are thus phase displaced by 90° relative to each other (quadrature signals).

It can be further discerned in FIG. 2 that two frequency mixers 19a, 19b are arranged in the phase control loop. A first input of a first frequency mixer 19a is connected to the measurement signal output 12 of the first magnetic field sensor 3 and a second input of the first frequency mixer 19a is connected to the first oscillator output 7a. In an analogous manner the first input of a second frequency mixer 19b is connected to the measurement signal output 13 of the second magnetic field sensor 4 and a second input of the second frequency mixer 11b is connected to the second oscillator output 7b. The multiplexer 14 or the rotary switch provided in FIG. 1 is thus lacking in FIG. 2.

The mixer outputs 20a, 20b of the frequency mixers 19a, 19b are in each case connected to an input of an adding element 29. The output of the adding element 29 is connected via an analog low pass 22 to an input of a comparator 23 synchronized with a clock signal. The frequency of the clock signal is four times higher than the clock frequency $f_{clk}$ of the clock 18 divided by the number of clock pulses N that a rotation cycle lasts. The scanning rate $f_s$ of the follow-on oscillator 6 thus equals $f_s=4f_{clk}/N$, and the resolution is equal to Id(N) bit.

The phasing detector in FIG. 2 corresponds to that in FIG. 1, and therefore reference is made to the corresponding description.

The invention claimed is:

1. A device for measuring an angle at which a magnetic field is aligned in a plane relative to a reference axis with at least two magnetic field sensors, which are aligned with their measurement axes in and/or parallel to the plane and oriented at right angles to each other, wherein the device has a PLL phase control circuit with a follow-on oscillator arranged in a phase control loop, further characterized in that the follow-on oscillator has at least one oscillator output for a digital oscillating signal, further characterized in that the magnetic field sensors are coupled to the phase control loop in such a way that the digital oscillating signal is phase synchronous with a rotation scanning signal formed by rotary scanning of the measurement signals of the magnetic field sensors, and still further characterized in that the oscillator output is connected to a phasing detector for determining the phasing of the digital oscillating signal.

2. The device as in claim 1, characterized in that the magnetic field sensors are connected to a scanning device in such a way that the measurement signals of the individual magnetic field sensors are capable of being applied successively to an output terminal for the rotation scanning signal and further characterized in that the output terminal is connected to a synchronization signal input of the PLL phase control circuit.

3. The device as in claim 1, characterized in that each magnetic field sensor always has a measurement signal output connected to an input terminal of a multiplexer, and further characterized in that the multiplexer has an output capable of being connected to the individual input terminals which forms the output terminal for the rotation scanning signal.

4. The device as in claim 1, characterized in that the output terminal for the rotation scanning signal is connected to a first input of a frequency mixer and the oscillator output of the follow-on oscillator is connected to a second input of the frequency mixer, and further characterized in that a mixer output of the frequency mixer is connected via at least one low pass and at least one synchronized comparator to a frequency control input of the follow-on oscillator.

5. The device as in claim 1, characterized in that the phasing detector has a quadrant detector, which has a first polarity detector and a second polarization detector, further characterized in that an input of the first polarization detector is connected to a measurement signal output of a first magnetic field sensor and an input of the second polarization detector is connected to a measurement signal output of a second magnetic field sensor, and still further characterized in that the second magnetic field sensor is aligned with its measurement axis orthogonally to the measurement axis of the first magnetic field sensor.

6. The device as in claim 1, characterized in that the magnetic field sensors are Hall sensors, which have a switching device for the orthogonal switching of the Hall sensor supply current and the Hall voltage taps, and further characterized in that the switching device has a clock input connected to a clock for a switching signal.

7. The device as in claim 1, characterized in that the pulse frequency of the switching clock signal of at least one magnetic field sensor is chosen so that within a scanning cycle, during which the measurement signal of this magnetic field sensor is coupled to the phase control loop, the orthogonal switching device assumes at least two and preferably four switching statuses.

8. The device as in claim 1, characterized in that the pulse frequency of the switching clock signal of at least one magnetic field sensor is chosen so that the Hall sensor supply current of the magnetic field sensor changes its direction once after each rotation cycle of the rotation scanning signal.

9. The device as in claim 1, characterized in that the comparator has a clock signal input connected to a clock signal generator, and further characterized in that the clock signal generator is configured so that the pulse frequency of a comparator clock signal residing at the clock signal input is at least twice as high as the rotation frequency of the rotation scanning signal.

10. The device as in claim 1, characterized in that the follow-on oscillator has a number of oscillator outputs corresponding to the number of the magnetic field sensors with their measurement axes aligned perpendicular relative to each other for digital oscillating signals phase displaced relative to each other, further characterized in that a number of frequency mixers corresponding to the aforesaid number are arranged in the phase control loop, further characterized in that each frequency mixer always has a first input connected to a measurement signal output of a magnetic field sensor allocated to the frequency mixer and a second input connected to one of the oscillator outputs, and still further characterized in that mixer outputs of the frequency mixers are connected to the frequency control input of the follow-on oscillator via an adding element, at least one low pass and at least one synchronized comparator.

11. A method for measuring an angle at which a magnetic field is aligned in a plane relative to a reference axis, wherein a first magnetic field component (Vx) and a second magnetic field component (Vy) aligned at right angles thereto are measured in and/or parallel to the plane characterized in that at least one digital oscillating signal is generated, further characterized in that the phasing of the digital oscillating signal is controlled so that it is phase synchronous with the phasing of a rotation scanning signal formed by rotary scanning of the measurement signals of the magnetic field sensors, and still further characterized in that the angle is determined from the phasing of the digital oscillating signal.

* * * * *